(12) United States Patent
Washiyama et al.

(10) Patent No.: US 6,178,028 B1
(45) Date of Patent: Jan. 23, 2001

(54) MULTIBEAM SCANNING EXPOSURE DEVICE

(75) Inventors: Hiroyuki Washiyama, Tokyo; Masato Noguchi, Saitama-ken, both of (JP)

(73) Assignee: Asahi Kogaku Kogyo Kabushiki Kaisha, Tokyo (JP)

( * ) Notice: Under 35 U.S.C. 154(b), the term of this patent shall be extended for 0 days.

(21) Appl. No.: 09/263,261

(22) Filed: Mar. 5, 1999

(30) Foreign Application Priority Data

Mar. 6, 1998 (JP) .................................................. 10-055595

(51) Int. Cl.[7] .................................................. G02B 26/08
(52) U.S. Cl. .......................... 359/204; 359/566; 359/569; 359/575
(58) Field of Search .................................. 359/204, 566, 359/569, 574, 575

(56) References Cited

U.S. PATENT DOCUMENTS

| | | | |
|---|---|---|---|
| 5,210,635 | * 5/1993 | Nagata et al. | 359/204 |
| 5,574,597 | 11/1996 | Kataoka | 359/569 |
| 5,798,784 | 8/1998 | Nonaka et al. | 347/243 |

FOREIGN PATENT DOCUMENTS 10-26706   7/1997   (JP) .
10-78504   7/1997   (JP) .

OTHER PUBLICATIONS

Pp. 3456–3464 of Optical Engineering, vol. 34 No. 12, published in Dec., 1995.

Pp. 2540–2547 of Applied Optics, vol. 34, No. 14, published in May 1995.

* cited by examiner

Primary Examiner—Darren Schuberg
(74) Attorney, Agent, or Firm—Greenblum & Bernstein, P.L.C.

(57) ABSTRACT

A multibeam scanning exposure device includes a light source for emitting a light beam, a multiple beam splitting element that is provided with a diffractive grating for dividing the light beam from the light source into a plurality of beams, a deflector for deflecting exit beams from the multiple beam splitting element, and a scanning lens for converging the deflected beams onto the photosensitive medium to form a plurality of scanning beam spots. The diffractive grating has a corrugated surface having a plurality of periodical patterns arranged in parallel at a predetermined fixed pitch. Since the incident light beam in the multiple beam splitting element from the light source is divided into a plurality of beams at once, there are no influence of the assembling error and therefore the arrangement of the beam spots on the photosensitive medium can be controlled accurately.

2 Claims, 6 Drawing Sheets

FIG. 8

MULTIBEAM SCANNING EXPOSURE DEVICE

BACKGROUND OF THE INVENTION

The present invention relates to a multibeam scanning exposure device that forms a plurality of scanning beam spots to form a drawing pattern on a photosensitive medium. Particularly, the present invention relates to the device that includes a multiple beam splitting element to divide a single light beam from a light source into a plurality of light beams.

U.S. Pat. No. 5,798,784 discloses a multibeam scanning exposure device, for example. The disclosed device is provided with an Argon laser as a light source, a half mirror to divide a light beam from the Argon laser into two beams, a pair of a multiple beam splitting elements for each of the divided light beams to further split the divided light beam into eight beams respectively and a scanning optical system that forms sixteen scanning beams on the photosensitive medium.

Figure 8:
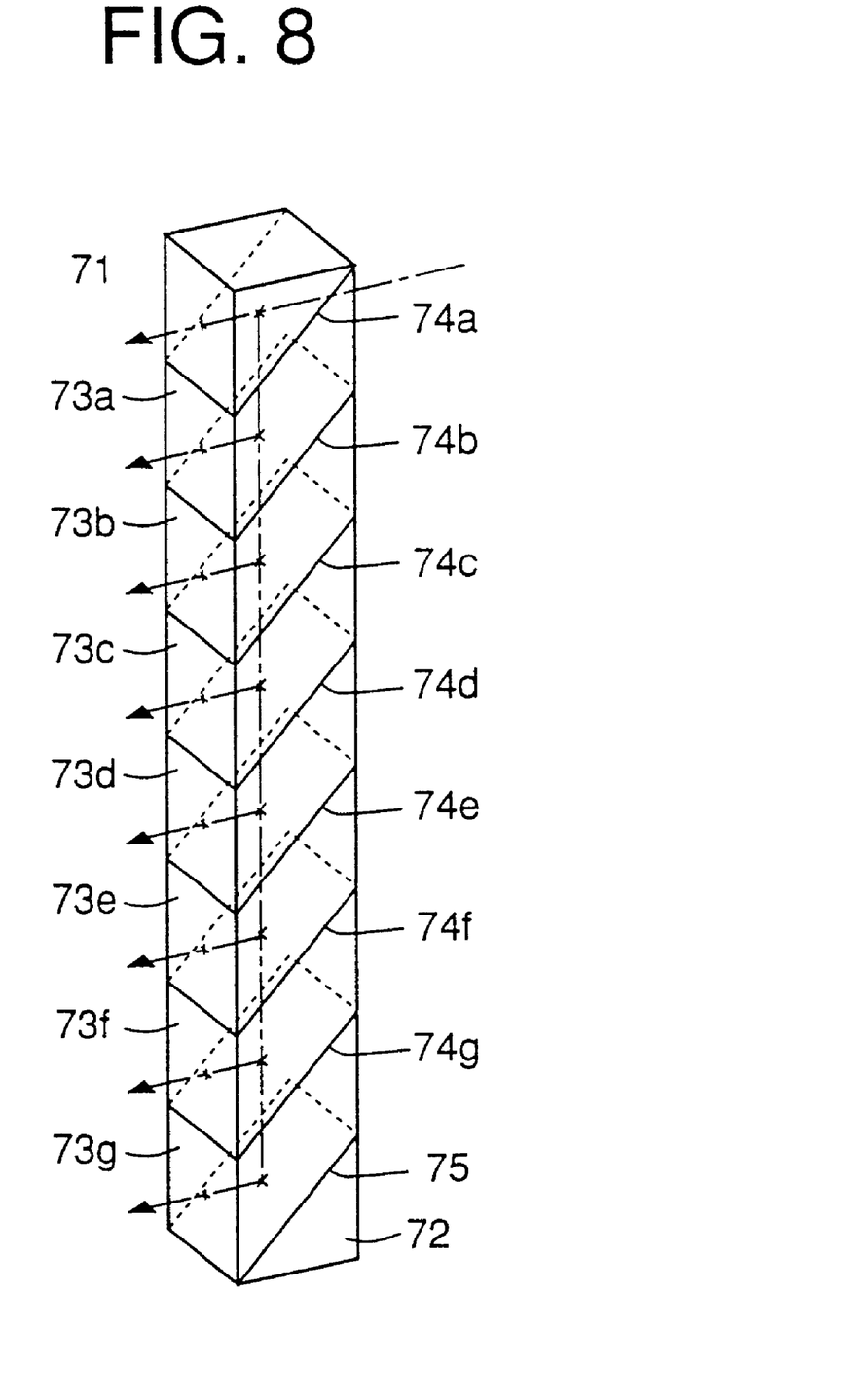
FIG. 8 is a perspective view of a conventional multiple beam splitting element.

FIG. 8 is a perspective view showing the multiple beam splitting element that is used in an optical system of the device disclosed in the publication. The multiple beam splitting element consists of first and second right angle prisms 71 and 72 at both ends and first through seventh parallel plate prisms 73a through 73g arranged between the right angle prisms 71 and 72. These prisms are cemented with each other using organic adhesive such as epoxy resin adhesive.

Beam splitting films 74a through 74g are formed at the boundary between the first right angle prism 71 and the first parallel plate prism 73a and at the boundaries among the parallel plate prisms 73a through 73g. A reflection film 75 is formed at the boundary between the seventh parallel plate prism 73g and the second right angle prism 72.

An incident beam into the first parallel plate prism 73a from the rear side in FIG. 8 is divided into eight beams by the beam splitting films 74a through 74g, and then the parallel eight beams are exited from the first right angle prism 71 and the parallel plate prisms 73a through 73g.

Since the conventional multiple beam splitting element consists of the plurality of prisms cemented to each other, it is difficult to align the prisms in high-precision because it may include both of processing error of each prism and assembling error among the prisms. The error of the element has a bad influence on the parallelism of the exit beams, resulting in disorder of the arrangement of the scanning spots on the photosensitive medium, which deteriorates printing quality.

Further, the irradiation energy of the laser beam carbonizes the organic adhesive among the prisms of the multiple beam splitting element, lowering transmittances of the boundaries among the prisms, which loses the power balance among the eight exit beams. The conventional multiple beam splitting element has, therefore, short life span, which requires frequent exchanges of the multiple beam splitting element. Moreover, the intensity of the incident beam into the multiple beam splitting element should be controlled in low level in order to extend the life span of the multiple beam splitting element.

SUMMARY OF THE INVENTION

It is therefore an object of the present invention to provide an improved multibeam scanning exposure device, which is capable of accurately aligning the scanning bead spots on the photosensitive medium and increasing a power resistance of the multiple beam splitting element.

For the above object, according to the present invention, there is provided a multibeam scanning exposure device, which includes:

a light source for emitting a light beam;

a multiple beam splitting element that is provided with a diffractive grating for dividing the light beam from the light source into a plurality of beams, the diffractive grating having a corrugated surface having a plurality of periodical patterns arranged in parallel at a predetermined fixed pitch;

a deflector for deflecting exit beams from the multiple beam splitting element; and a scanning lens for converging the deflected beams onto the photosensitive medium to form a plurality of scanning beam spots.

With this construction, since the incident light beam in the multiple beam splitting element from the light source is divided into a plurality of beams at once, there are no influence of the assembling error and therefore the arrangement of the beam spots on the photosensitive medium can be controlled accurately.

The phase pattern may have a shape that causes non-linear phase difference to the beam passing therethrough within one pitch and the adjacent phase patterns may be, connected without phase gaps at the boundaries therebetween.

DESCRIPTION OF THE EMBODIMENTS

Figures 1A, 1B:
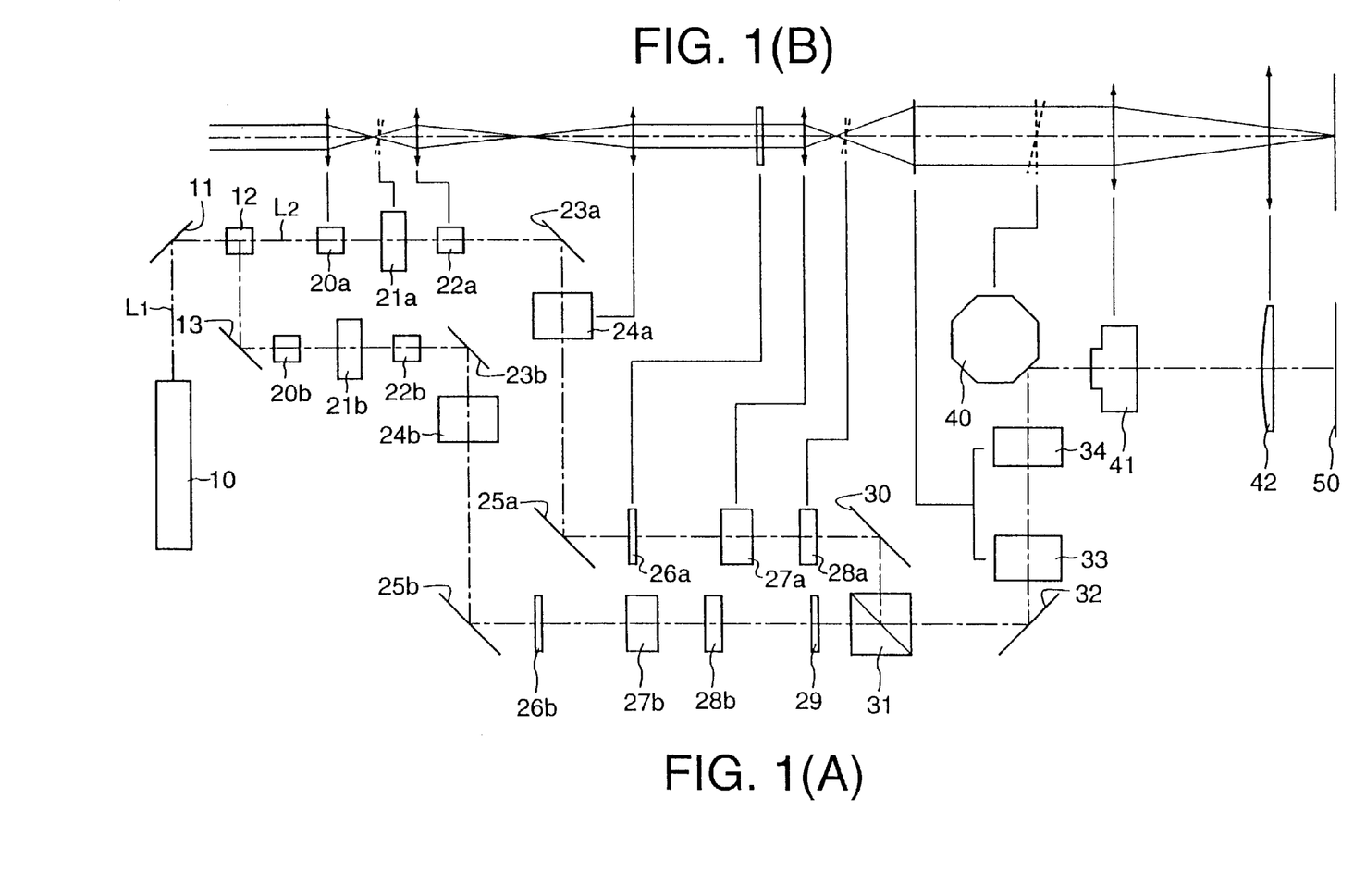
FIG. 1(A) shows an arrangement of optical elements of a multibeam scanning exposure device in a main scanning direction.
FIG. 1(B) shows the arrangement in an auxiliary scanning direction, according to an embodiment of he present invention.
Figure 2A:
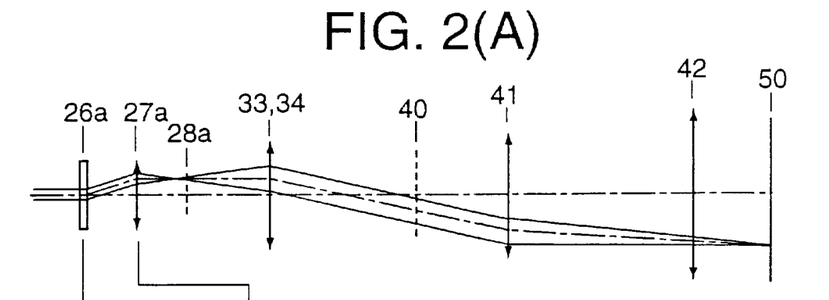
FIG. 2(A) shows a light path in the optical system shown in FIG. 1(B)
Figure 2B:
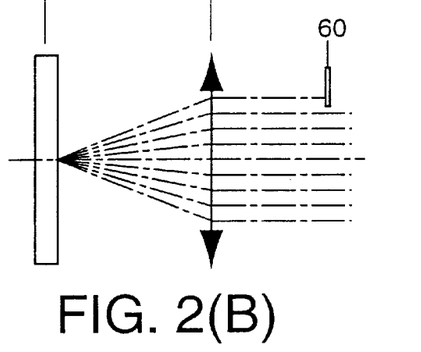
FIG. 2(B) is an enlarged view of FIG. 2(A)

FIGS. 1(A) and 1(B) show an arrangement of optical elements of a multiple scanning exposure device according to a embodiment of the present invention. FIG. 1(A) is a view in a main scanning direction and FIG. 1(B) is an outlined view in an auxiliary scanning direction. The main scanning direction is defined as a direction along which light beams scan on a photosensitive medium, the auxiliary scanning direction is perpendicular to the main scanning direction on the photosensitive medium. Further, FIG. 2(A) shows an optical path of one of the divided beams in the device of the embodiment, FIG. 2(B) is an enlarged view of a part of the FIG. 2(A).

The optical system of the multibeam scanning exposure device includes a laser source 10 such as an Argon laser for emitting a laser beam L1, a half mirror prism 12 for dividing the laser beam L1 into two beams L2 and L3, a pair of multiple beam splitting elements 26a and 26b for splitting the beams L2 and L3 into nine beams respectively, a pair of multi-channel (eight-channel) acousto-optic modulator (AOM) 28a and 28b for independently modulating eight of nine beams respectively, a polarizing beam splitter 31 for combining the (sixteen beams, and a scanning optical system that contains a polygon mirror 40 and an fθ lens (scanning lens) 41. The sixteen beams are deflected by the polygon mirror 40 and form sixteen scanning spots on a photosensitive medium 50 through the fθ lens 41.

The beam spots scan on the photosensitive medium 50 in the main scanning direction that is parallel to the paper face of FIG. 1(A), the photosensitive medium 50 is driven in the auxiliary scanning direction that is perpendicular to the paper face of FIG. 1(A).

Details of the optical system will be described hereinafter with reference to FIGS. 1(A), 1(B) and 2.

The laser beam L1 emitted from the laser source 10 is reflected by a mirror 11 to be incident on the half mirror prism 12. The transmitted beam L2 through the half mirror prism, 12 is converged by a first lens 20a having a positive refracting power, and is incident on the AOM 21a located at the rear side of the converged point of the beam along a beam proceeding direction as shown in FIG. 1(B). The AOM 21a controls an exit angle therefrom to correct a positioning error of the beam spots on the photosensitive medium 50 due to an inclination error of the reflecting surfaces of the polygon mirror 40. The divergent exit beam from the AOM 21a is converged by a second lens 22a having a positive refracting power. The beam from the second lens is reflected by a mirror 23a, and then the beam is incident on a third lens 24a having a positive ref acting power to collimate the incident beam.

The collimated beam through the third lens 24a is reflected by a mirror 25a to be incident onto the multiple beam splitting element 26a. The beam splitting element 26a is provided with a diffractive grating that is designed for dividing an incident beam into the nine beams. The incident single beam is diffracted and divided in the auxiliary scanning direction into nine beams by the multiple beam splitting element 26a as shown in FIG. 2(B). The divided nine beams are converged by a fourth lens (condenser) 27a having a positive refracting power. One of the nine exit beams from the fourth lens 27a is shaded by a shading plate 60 (see FIG. 2(B)) and the other eight beams are incident on the multi-channel AOM 28a. The multiple beam splitting element 26a is located at the front focal point of the fourth lens 27a and the location of the multi-channel AOM 28a is substantially coincident with, but a rear side of the converged point of the beam.

The multi-channel AOM 28a is provided with eight modulating units that independently switch exit angles of the eight beams. At an ON state, the beam is diffracted by the modulating unit at a predetermined angle and exits toward a mirror 30. On the contrary, the beam passes through the modulating unit without being diffracted at an OFF state and is shaded by a shading plate. The exit beams reflected by the mirror 30 are incident on the polarizing beam splitter 31 as S-polarized beams and therefore they are reflected by the polarizing beam splitter 31 to form the beam spot on the photosensitive medium 50.

The similar optical elements for the beam L2 are arranged along the optical path of the beam L3 that is reflected by the half mirror prism 12. The reflected beam L3 progresses via a first lens 20b, an AOM 21b for correcting positioning error of the spots, the second lens 22b, a mirror 23b, a third lens 24b, a mirror 25b, the multiple beam splitting element 26b and a fourth lens (condenser) 27b. The exit beams from the fourth lens 27b are incident on the multi-channel AOM 28b to be modulated. The modulated beams pass through a half-wave plate 29 and are incident on the polarizing beam splitter 31 as P-polarized light to transmit the polarizing beam splitter 31.

The combined sixteen divergent beams from the polarizing beam splitter 31 are collimated through fifth and sixth lenses 33 and 34, which form a collimator lens, and then the beams are reflected and deflected by the polygon mirror 40 at the same time. The deflected sixteen beams are focused on the photosensitive medium 50 at the different points in the auxiliary scanning direction respectively through the fθ lens 41 and a condenser lens 42.

Since the multiple scanning exposure device according to the embodiment employs the multiple beam splitting elements 26a and 26b of the grating type, the incident beam from the laser source 10 is divided into a plurality of beams at a time using diffractive function. This can prevent influence of the assembling error that is a problem in the conventional beam splitting element and therefore the arrangement of the beam spots on the photosensitive medium 50 can be aligned accurately.

Further, since the multiple beam splitting elements 26a and 26b are constructed without using adhesive, they have higher power resistances and longer life span than the conventional elements using organic adhesive.

Figure 3:
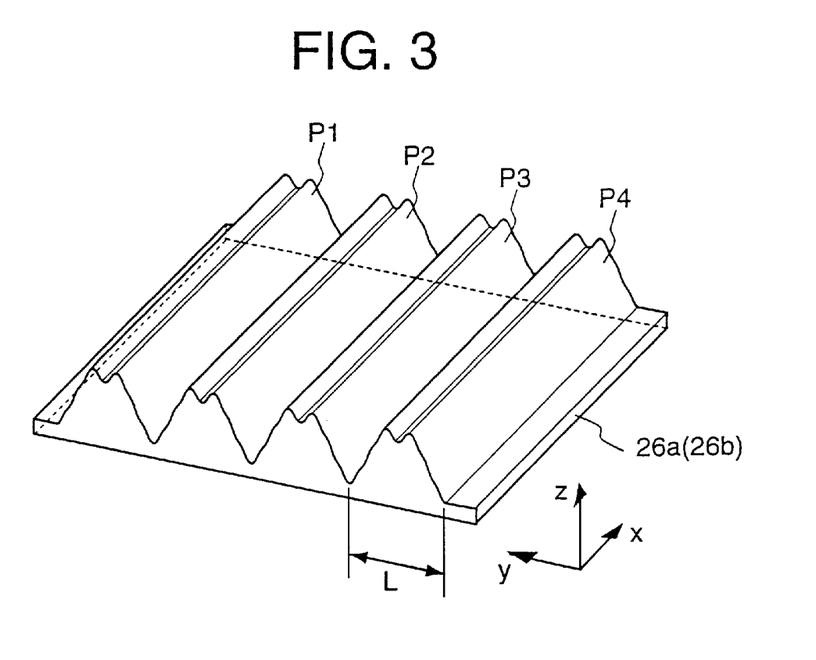
FIG. 3 is an enlarged perspective view of a diffractive grating formed on the multiple beam splitting element of the embodiment.

The details of the diffractive grating formed on one side surface of each of the multiple beam splitting elements 26a and 26b will be described hereinafter. FIG. 3 is an enlarged perspective view of grating formed on the multiple beam splitting elements 26a and 26b. The diffractive grating has a corrugated surface having a plurality of periodical phase patterns P1, P2, P3 . . . that are linearly extended in an x-axis direction and are arranged at a predetermined fixed pitch in a y-axis direction. The phase patterns have a predetermined width L along the y-axis direction. The x-axis direction corresponds the main scanning direction and the y-axis direction corresponds the auxiliary scanning direction. The multiple beam splitting elements 26a and 26b are made of, for example, glass or a transparent resin.

A cross section along the y-z plane has a shape that causes non-linear phase difference to the beam passes therethrough within one pitch. There are no phase gaps at the boundaries among the adjacent phase patterns. That is, one phase pattern is smoothly connected to the adjacent phase patterns. Phase difference δ at a point $y_0$ is defined as a difference of phases between a beam incident at the point $y_0$ and a beam incident at the lowermost portion of the phase pattern. In the phase pattern in FIG. 3, the change of the phase difference δ corresponding to the change of the incident point along the y-axis direction is represented by non-linear function.

The diffractive grating having complex phase patterns as the embodiment is difficult to be made using a holography process or an etching process. Accordingly, the diffractive grating is molded using a metal mold. However, if the surface on which a master pattern is formed is a flat surface, a cutting tool for forming the pattern is to be moved three dimensionally, i.e., in the x, y and z axis directions relative to the surface. Considering the size of the diffractive grating, it may be very difficult to control the movement of the cutting tool to form the pattern precisely.

In this embodiment, the phase patterns are formed on a concave cylindrical surface of which circumference direction is coincident with the x-axis direction. The height of each phase pattern varies only along the y-axis direction and is constant along the x-axis direction, which allows using the cylindrical mold.

Use of the cylindrical mold requires only two dimensional adjustment (i.e., the y-axis direction and the z-axis direction) for the cutting tool with respect to the mold. Thus, the phase patterns can be engraved accurately in a short time and at a low cost.

The mold is then used as a master to form the multiple beam splitting elements 26a and 26b through a well-known injection mold method.

Accordingly, the molded multiple beam splitting element of the embodiment has a meniscus cylindrical shape, while the element can be considered as a flat shape because the radius of curvature of the cylindrical surface is relatively large with respect to the size of the element. The phase patterns may be formed on the incident surface or on the exit surface, there is no difference for the diffracting function.

TABLE 1 shows data for the phase pattern of the grating formed on the multiple beam splitting elements 26a and 26b According to the embodiment. In TABLE 1, "Coord." (designated 0–63) represents the position in the y-axis direction when the pitch width L of the phase pattern is divided into 64 coordinates, and "δ" represents the phase difference at the corresponding coordinate with respect to the phase at the lowermost portion (Coord.=0) as described above. The phase difference δ is given in radians. Accordingly, a height H along the z-axis direction (i.e., an actual height of the phase pattern) in micrometers (vm) may be calculated, for a predetermined incident beam, using the formula:

$$H = \delta \times \lambda / (2\pi(n-1)),$$

where n is a refractive index of the material of the multiple beam splitting elements 26a and 26b and λ is a wavelength of the incident beam. It is assumed that the multiple beam splitting elements are located within air whose refractive index is regarded as 1.

Figure 4:
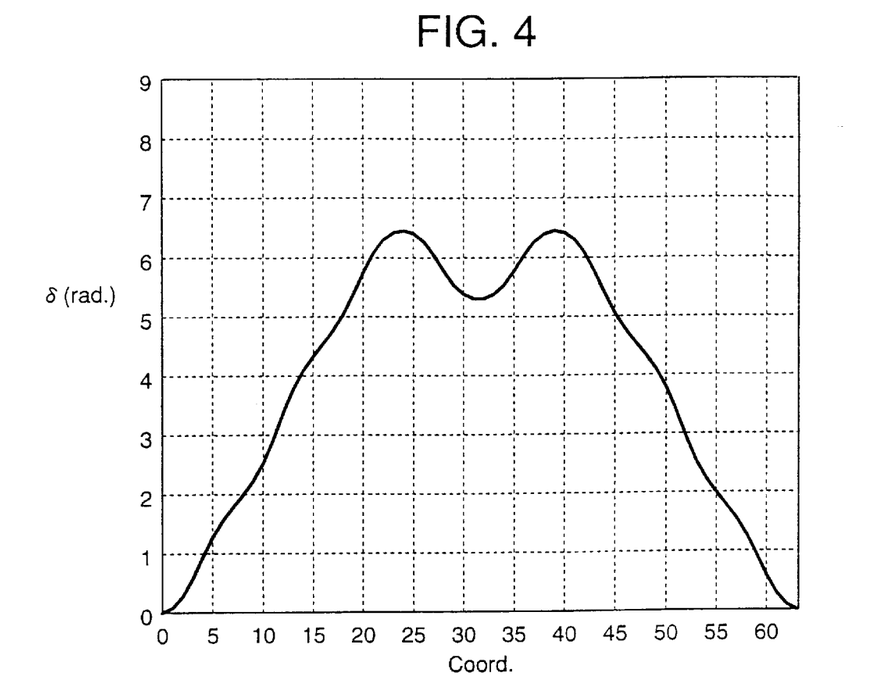
FIG. 4 is a graph showing a phase pattern of the diffractive orating according to the embodiment.

The data is shown graphically in FIG. 4 where a vertical axis is the phase difference δ and a horizontal axis is the coordinate along the y-axis direction.

The phase pattern is designed for splitting a single beam into nine beams with optimizing to satisfy the conditions: (1) intensities of all emitted beams are substantially the same, and (2) only the intended number of emitted beats are emitted.

TABLE 1

| Coord. | δ | Coord. | δ | Coord. | δ |
|---|---|---|---|---|---|
| 0 | 0.00000 | 22 | 6.29969 | 43 | 5.74883 |
| 1 | 0.08727 | 23 | 6.42061 | 44 | 5.37594 |
| 2 | 0.28157 | 24 | 6.45338 | 45 | 5.03895 |
| 3 | 0.58121 | 25 | 6.40383 | 46 | 4.77212 |
| 4 | 0.94548 | 26 | 6.26897 | 47 | 4.54875 |
| 5 | 1.28199 | 27 | 6.04448 | 48 | 4.33621 |
| 6 | 1.55363 | 28 | 5.77626 | 49 | 4.09535 |
| 7 | 1.77708 | 29 | 5.53539 | 50 | 3.78851 |
| 8 | 1.98986 | 30 | 5.37669 | 51 | 3.38602 |
| 9 | 2.22728 | 31 | 5.29971 | 52 | 2.93113 |
| 10 | 2.53102 | 32 | 5.29971 | 53 | 2.53102 |
| 11 | 2.93113 | 33 | 5.37669 | 54 | 2.22728 |
| 12 | 3.38602 | 34 | 5.53539 | 55 | 1.98986 |
| 13 | 3.78851 | 35 | 5.77626 | 56 | 1.77708 |
| 14 | 4.09535 | 36 | 6.04448 | 57 | 1.55363 |
| 15 | 4.33621 | 37 | 6.26897 | 58 | 1.28199 |
| 16 | 4.54875 | 38 | 6.40383 | 59 | 0.94548 |
| 17 | 4.77212 | 39 | 6.45338 | 60 | 0.58121 |
| 18 | 5.03895 | 40 | 6.42061 | 61 | 0.28157 |
| 19 | 5.37594 | 41 | 6.29969 | 62 | 0.08727 |
| 20 | 5.74883 | 42 | 6.07744 | 63 | 0.00000 |
| 21 | 6.00744 | | | | |

Figure 5:
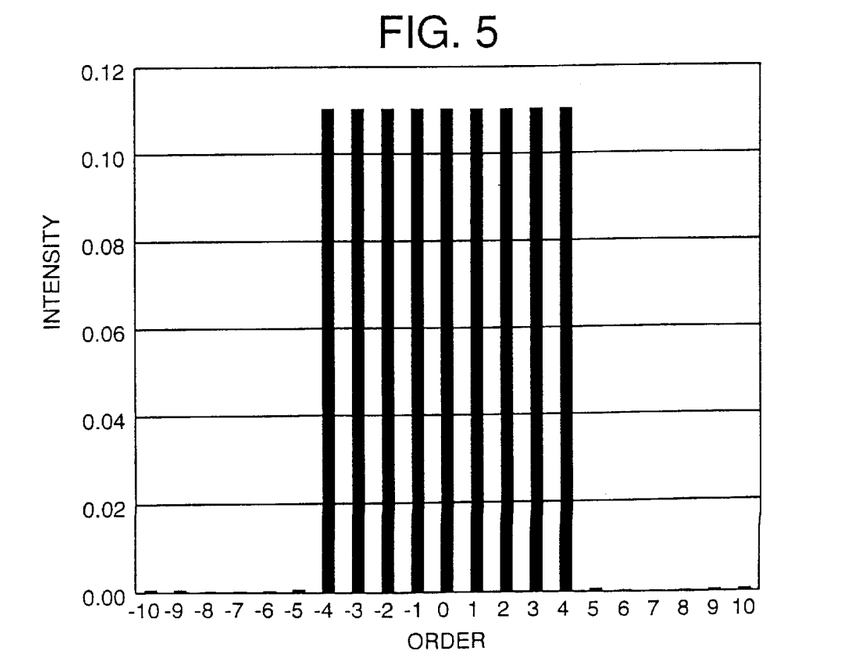
FIG. 5 is a graph showing a distribution of intensities of the divided beams according to the diffractive grating consisting of the phase pattern shown in FIG. 4.

The following TABLE 2 shows the intensity of each exit beams from the multiple beam splitting element as a relative intensity when the intensity of the incident beam is defined as 1. FIG. 5 is a graphical representation of TABLE 2. The horizontal axis represents the order of the emitted diffracted beam and the vertical axis represents the intensity of each order where the intensity of the incident beam is defined as 1.

TABLE 2

| Order | Intensity | Order | Intensity |
|---|---|---|---|
| −10 | 0.00059 | 1 | 0.11031 |
| −9 | 0.00054 | 2 | 0.11031 |
| −8 | 0.00021 | 3 | 0.11031 |
| −7 | 0.00021 | 4 | 0.11031 |
| −6 | 0.00036 | 5 | 0.00076 |
| −5 | 0.00076 | 6 | 0.00036 |
| −4 | 0.11031 | 7 | 0.00021 |
| −3 | 0.11031 | 8 | 0.00021 |
| −2 | 0.11031 | 9 | 0.00054 |
| −1 | 0.11031 | 10 | 0.00059 |
| 0 | 0.11031 | | |

The diffractive efficiency, which is a ratio of the total intensity of the intended emitted beams of orders −4 to +4 to the intensity of the incident beam, is 99.28%. Further, the intensities of the intended beams are standardized. According to the embodiment, the multiple beam splitting element has extremely high diffractive efficiency and the intensity of the incident beam can be equally distributed when the phase patterns are formed as designed.

Figure 6:
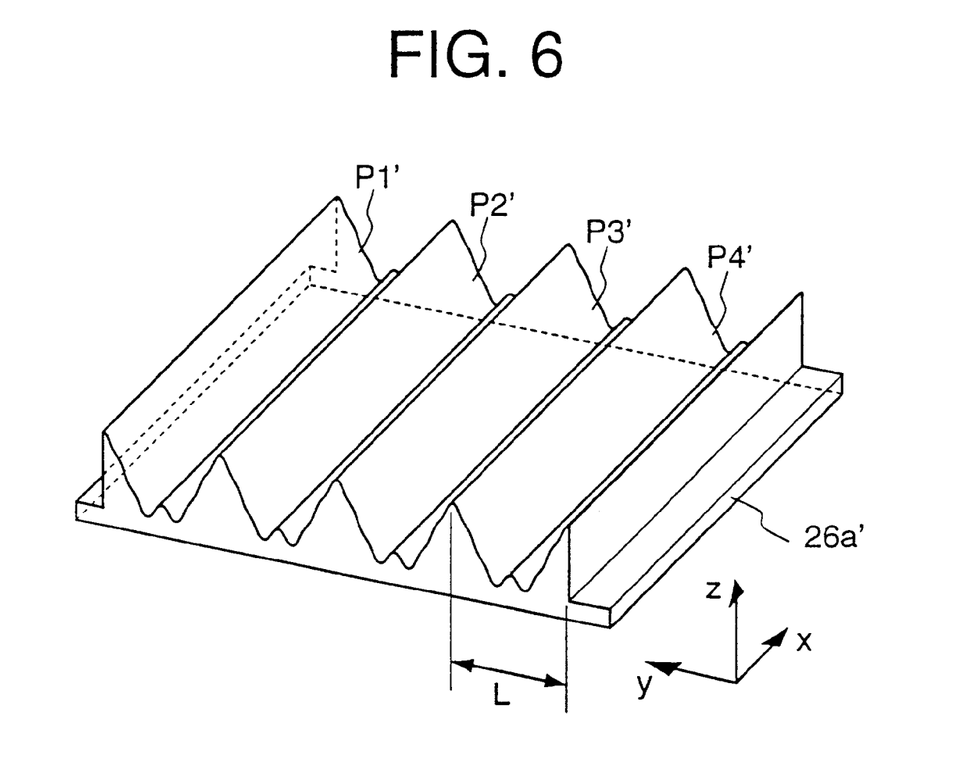
FIG. 6 is an enlarged perspective view of a diffractive grating formed on the multiple beam splitting element according to a variation of the embodiment.
Figure 7:
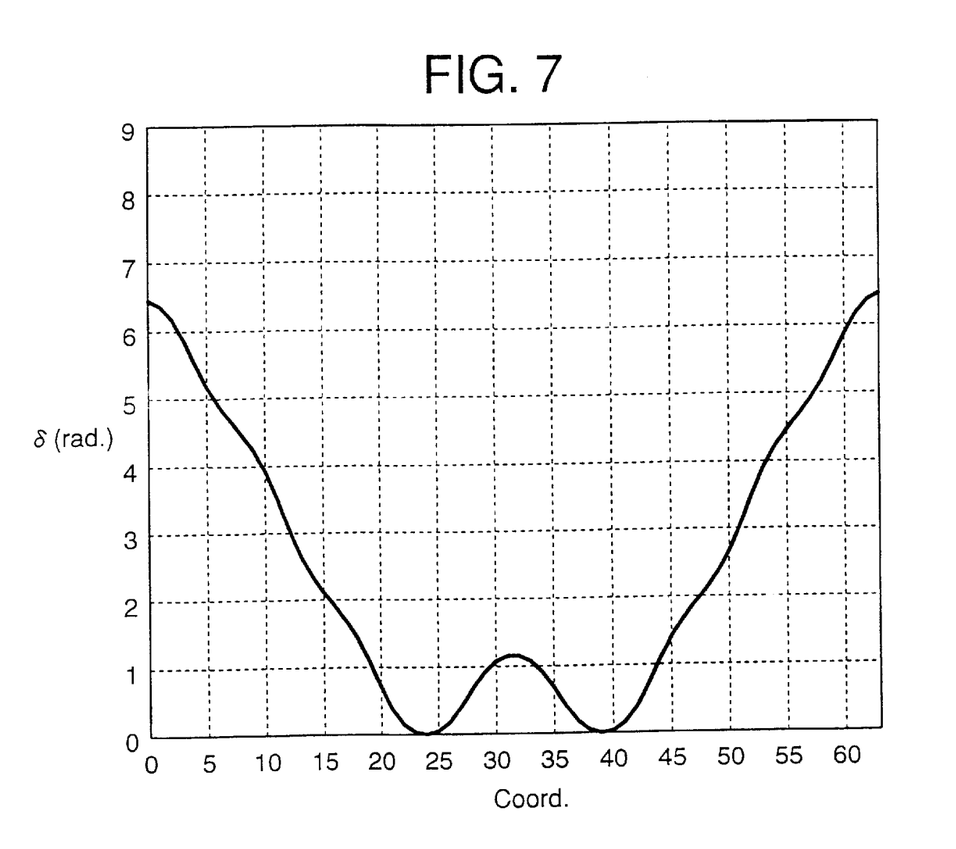
FIG. 7 is a graph showing a phase pattern of the diffractive grating according to a variation of the embodiment.

A diffractive grating has the same function even if a relief profile of a phase pattern is inverted. FIG. 6 shows the inverted phase patterns P1', P2', P3' and P4' of a multiple beam splitting element 26a'. TABLE 3 shows data for the inverted phase pattern of the embodiment shown in TABLE 1. FIG. 7 is a graph showing the inverted phase pattern shown in TABLE 3. The diffractive grating having the inverted phase patterns exhibits the identical intensity distribution and diffractive efficiency as shown in TABLE 2.

TABLE 3

| Coord. | δ | Coord. | δ | Coord. | δ |
|---|---|---|---|---|---|
| 0 | 6.45338 | 22 | 0.15369 | 43 | 0.70455 |
| 1 | 6.36611 | 23 | 0.03277 | 44 | 1.07744 |
| 2 | 6.17181 | 24 | 0.00000 | 45 | 1.41443 |
| 3 | 5.87217 | 25 | 0.04955 | 46 | 1.68126 |
| 4 | 5.50790 | 26 | 0.18441 | 47 | 1.90463 |
| 5 | 5.17139 | 27 | 0.40890 | 48 | 2.11717 |
| 6 | 4.89975 | 28 | 0.67712 | 49 | 2.35803 |
| 7 | 4.67630 | 29 | 0.91799 | 50 | 2.66487 |
| 8 | 4.46352 | 30 | 1.07669 | 51 | 3.06736 |
| 9 | 4.22610 | 31 | 1.15367 | 52 | 3.52225 |
| 10 | 3.92236 | 32 | 1.15367 | 53 | 3.92236 |
| 11 | 3.52225 | 33 | 1.07669 | 54 | 4.22610 |
| 12 | 3.06736 | 34 | 0.91799 | 55 | 4.46352 |
| 13 | 2.66487 | 35 | 0.67712 | 56 | 4.67630 |
| 14 | 2.35803 | 36 | 0.40890 | 57 | 4.89975 |
| 15 | 2.11717 | 37 | 0.18441 | 58 | 5.17139 |
| 16 | 1.90463 | 38 | 0.04955 | 59 | 5.50790 |
| 17 | 1.68126 | 39 | 0.00000 | 60 | 5.87217 |
| 18 | 1.41443 | 40 | 0.03277 | 61 | 6.17181 |
| 19 | 1.07744 | 41 | 0.15369 | 62 | 6.36611 |
| 20 | 0.70455 | 42 | 0.37594 | 63 | 6.45338 |
| 21 | 0.37594 | | | | |

The present disclosure relates to the subject matter contained in Japanese Patent Application No. HEI 10-55595, filed on Mar. 6, 1998, which is expressly incorporated herein by reference in its entirety.

What is claimed is:

1. A multibeam scanning exposure device that forms a plurality of scanning beam spots on a photosensitive medium, comprising:

a light source that emits a light beam;

a multiple beam splitting element provided with a diffractive grating that divides said light beam from said light source into a plurality of beams, said diffractive grating having a corrugated surface with a plurality of periodical phase patterns arranged in parallel at a predetermined fixed pitch, said multiple beam splitting element dividing a single beam into an odd number of beams, each periodical phase pattern having a shape that causes a non-linear phase difference to said light beam passing therethrough within one pitch, adjacent phase patterns being connected without phase gaps at boundaries therebetween;

a deflector that deflects exist beams from said multiple beam splitting element; and a scanning lens that converges said deflected beams onto said photosensitive medium to form a plurality of scanning beam spot, wherein each periodical phase pattern of said plurality of periodical phase patterns is formed such that a phase difference $\delta$ at a coordinate Coord. falls within an allowable range around a center value indicated in a table below when a width of said periodical phase pattern is divided into 64 coordinates, and wherein said diffractive grating divides said incident beam into nine beams:

| Coord. | $\delta$ | Coord. | $\delta$ | Coord. | $\delta$ |
|---|---|---|---|---|---|
| 0 | 0.00000 | 22 | 6.29969 | 43 | 5.74883 |
| 1 | 0.08727 | 23 | 6.42061 | 44 | 5.37594 |
| 2 | 0.28157 | 24 | 6.45338 | 45 | 5.03895 |
| 3 | 0.58121 | 25 | 6.40383 | 46 | 4.77212 |
| 4 | 0.94548 | 26 | 6.26897 | 47 | 4.54875 |
| 5 | 1.28199 | 27 | 6.04448 | 48 | 4.33621 |
| 6 | 1.55363 | 28 | 5.77626 | 49 | 4.09535 |
| 7 | 1.77708 | 29 | 5.53539 | 50 | 3.78851 |
| 8 | 1.98986 | 30 | 5.37669 | 51 | 3.38602 |
| 9 | 2.22728 | 31 | 5.29971 | 52 | 2.93113 |
| 10 | 2.53102 | 32 | 5.29971 | 53 | 2.53102 |
| 11 | 2.93113 | 33 | 5.37669 | 54 | 2.22728 |
| 12 | 3.38602 | 34 | 5.53539 | 55 | 1.98986 |
| 13 | 3.78851 | 35 | 5.77626 | 56 | 1.77708 |
| 14 | 4.09535 | 36 | 6.04448 | 57 | 1.55363 |
| 15 | 4.33621 | 37 | 6.26897 | 58 | 1.28199 |
| 16 | 4.54875 | 38 | 6.40383 | 59 | 0.94548 |
| 17 | 4.77212 | 39 | 6.45338 | 60 | 0.58121 |
| 18 | 5.03895 | 40 | 6.42061 | 61 | 0.28157 |
| 19 | 5.37594 | 41 | 6.29969 | 62 | 0.08727 |
| 20 | 5.74883 | 42 | 6.07744 | 63 | 0.00000 |
| 21 | 6.07744 | | | | |

2. A multibeam scanning exposure device that forms a plurality of scanning beam spots on a photosensitive medium, comprising:

a light source: that emits a light beam;

a multiple beam splitting element provided with a diffractive grating that divides said light beam from said light source into a plurality of beams, said diffractive grating having a corrugated surface with a plurality of periodical phase patterns arranged in parallel at a predetermined fixed pitch, said multiple beam splitting element dividing a single beam into an odd number of beams, each periodical phase pattern having a shape that causes a non-linear phase difference to said light beam passing therethrough within one pitch, adjacent phase patters being connected without phase gaps at boundaries therebetween;

a deflector that deflects exist beams from said multiple beam splitting element; and a scanning lens that converges said deflected beams onto said photosensitive medium to form a plurality of scanning beam spots, wherein each periodical phase pattern of said plurality of periodical phase patterns is formed such that a phase difference $\delta$ at a coordinate Coord. falls within an allowable range around a center value indicated in a table below when a width of said periodical phase pattern is divided into 64 coordinates, and wherein said diffractive grating divides said incident beam into nine beams:

| Coord. | $\delta$ | Coord. | $\delta$ | Coord. | $\delta$ |
|---|---|---|---|---|---|
| 0 | 6.45338 | 22 | 0.15369 | 43 | 0.70455 |
| 1 | 6.36611 | 23 | 0.03277 | 44 | 1.07744 |
| 2 | 6.17181 | 24 | 0.00000 | 45 | 1.41443 |
| 3 | 5.87217 | 25 | 0.04955 | 46 | 1.68126 |
| 4 | 5.50790 | 26 | 0.18441 | 47 | 1.90463 |
| 5 | 5.17139 | 27 | 0.40890 | 48 | 2.11717 |
| 6 | 4.89975 | 28 | 0.67712 | 49 | 2.35803 |
| 7 | 4.67630 | 29 | 0.91799 | 50 | 2.66487 |
| 8 | 4.46352 | 30 | 1.07669 | 51 | 3.06736 |
| 9 | 4.22610 | 31 | 1.15367 | 52 | 3.52225 |
| 10 | 3.92236 | 32 | 1.15367 | 53 | 3.92236 |
| 11 | 3.52225 | 33 | 1.07669 | 54 | 4.22610 |
| 12 | 3.06736 | 34 | 0.91799 | 55 | 4.46352 |
| 13 | 2.66487 | 35 | 0.67712 | 56 | 4.67630 |
| 14 | 2.35803 | 36 | 0.40890 | 57 | 4.89975 |
| 15 | 2.11717 | 37 | 0.18441 | 58 | 5.17139 |
| 16 | 1.90463 | 38 | 0.04955 | 59 | 5.50790 |
| 17 | 1.68126 | 39 | 0.00000 | 60 | 5.87217 |
| 18 | 1.41443 | 40 | 0.03277 | 61 | 6.17181 |
| 19 | 1.07744 | 41 | 0.15369 | 62 | 6.36611 |
| 20 | 0.70455 | 42 | 0.37594 | 63 | 6.45338 |
| 21 | 0.37594 | | | | |

* * * * *